(12) United States Patent
Iwade et al.

(10) Patent No.: US 9,386,707 B2
(45) Date of Patent: Jul. 5, 2016

(54) CIRCUIT SUBSTRATE AND METHOD OF FORMING CIRCUIT PATTERN

(71) Applicant: TORAY ENGINEERING CO., LTD., Tokyo (JP)

(72) Inventors: Takashi Iwade, Otsu (JP); Shinya Izumida, Otsu (JP); Kazuyuki Shishino, Otsu (JP); Kiyohito Yamamoto, Otsu (JP); Shigeru Tohno, Otsu (JP)

(73) Assignee: TORAY ELECTRONICS CO., LTD., Tokyo (JP)

( * ) Notice: Subject to any disclaimer, the term of this patent is extended or adjusted under 35 U.S.C. 154(b) by 126 days.

(21) Appl. No.: 14/363,184

(22) PCT Filed: Nov. 6, 2012

(86) PCT No.: PCT/JP2012/078669
§ 371 (c)(1),
(2) Date: Jun. 5, 2014

(87) PCT Pub. No.: WO2013/084640
PCT Pub. Date: Jun. 13, 2013

(65) Prior Publication Data
US 2014/0353016 A1    Dec. 4, 2014

(30) Foreign Application Priority Data

Dec. 9, 2011  (JP) ................. 2011-269873

(51) Int. Cl.
H05K 3/12    (2006.01)
H05K 1/02    (2006.01)

(52) U.S. Cl.
CPC ............. *H05K 3/125* (2013.01); *H05K 3/1208* (2013.01); *H05K 3/1241* (2013.01); *H05K 1/0296* (2013.01); *H05K 2201/09781* (2013.01); *H05K 2203/0126* (2013.01); *H05K 2203/1173* (2013.01)

(58) Field of Classification Search
CPC .... H05K 3/125; H05K 1/0296; H05K 3/1208
USPC ........................................ 174/255; 427/98.4
See application file for complete search history.

(56) References Cited

U.S. PATENT DOCUMENTS 5,818,483 A  * 10/1998  Mizutani .............. B41J 2/14209
                                                              347/71
2003/0059686 A1    3/2003  Kobayashi et al.
(Continued)

FOREIGN PATENT DOCUMENTS

JP    2000-249821    9/2000
JP    2003-309344    10/2003
(Continued)

OTHER PUBLICATIONS

International Search Report dated Feb. 5, 2013, from corresponding International Application No. PCT/JP2012/078669.

*Primary Examiner* — Timothy Thompson
*Assistant Examiner* — Charles Pizzuto
(74) *Attorney, Agent, or Firm* — Troutman Sanders LLP

(57) ABSTRACT

With a nozzle being moved in one direction to a substrate unit, conductive ink is discharged out of a slit of the nozzle in a belt-like manner to the substrate unit. The conductive ink is discharged in a belt-like manner to the substrate unit on which a liquid-repellent region having a liquid repellency to the conductive ink and a lyophilic region having a lyophilic property to the conductive ink and having the same form as a desired circuit pattern are formed. Thereby, the conductive ink is applied to the lyophilic region, while the conductive ink is repelled at the remaining liquid-repellent region and flows into the lyophilic region.

18 Claims, 9 Drawing Sheets

(56) References Cited

U.S. PATENT DOCUMENTS

| | | |
|---|---|---|
| 2004/0043334 A1 | 3/2004 | Kobayashi et al. |
| 2005/0003645 A1* | 1/2005 | Hirai ................ H01L 21/288 438/584 |
| 2005/0042320 A1 | 2/2005 | Hasei |
| 2007/0194449 A1* | 8/2007 | Hirai ................ G02F 1/136286 257/750 |
| 2007/0218192 A1 | 9/2007 | Kimura et al. |

FOREIGN PATENT DOCUMENTS

| | | | | |
|---|---|---|---|---|
| JP | 2004-170463 | | 6/2004 | |
| JP | 2005-013986 | | 1/2005 | |
| JP | 2007-243037 | | 9/2007 | |
| JP | 20070105245 | * | 10/2007 | ............ G02F 1/1345 |
| JP | 2011-048909 | | 3/2011 | |
| KR | 100915377 | * | 9/2009 | |
| KR | 2011001964 | * | 1/2011 | |

* cited by examiner

CIRCUIT SUBSTRATE AND METHOD OF FORMING CIRCUIT PATTERN

CROSS-REFERENCE TO RELATED APPLICATIONS

This is a U.S. national phase application under 35 U.S.C. §371 of International Patent Application No. PCT/JP2012/078669, filed on Nov. 6, 2012, and claims benefit of priority to Japanese Patent Application No. 2011-269873, filed Dec. 9, 2011. The International Application was published on Jun. 13, 2013, as International Publication No. WO 2013/084640 under PCT Article 21(2). The entire contents of these applications are hereby incorporated by reference.

TECHNICAL FIELD

The present invention relates to a circuit substrate and a method of forming a circuit pattern.

BACKGROUND ART

Conventionally, spattering, CVD, photolithography, and the like have been known for the process of forming a circuit pattern. In recent years, for the contribution to cost reduction, energy saving, and resource conservation, much attention has been paid to the technique of forming the circuit pattern using various printing techniques (printed electronics). Among these techniques, development has been made to the technique of making ink from metal nano-fine particles, dropping this ink onto a substrate unit (base member) from a nozzle of an inkjet apparatus, and then forming a desired circuit pattern (see, for example, Patent Literature 1).

A droplet (one drop) of the inkjet is of the order of picoliter. Therefore, a conductive film of a predetermined film thickness is formed by dropping multiple droplets onto the substrate unit and the circuit pattern is obtained by this conductive film. In order to obtain a desired circuit pattern form, the region in which the conductive film is to be formed is surrounded by a liquid-repellent bank and the droplet of the inkjet is dropped within the bank.

CITATION LIST

Patent Literature

PATENT LITERATURE 1: JP-A-2004-170463

SUMMARY OF INVENTION

Problem to be Solved by the Invention

When the circuit pattern is formed by the inkjet apparatus, however, in order to apply the ink to the entire substrate unit at a desired takt time, the inkjet apparatus is required to be provided with a plurality of inkjet heads each having multiple nozzles. Further, it is required to control the timing of discharging the ink from the respective of the multiple nozzles of each inkjet head according to the size and form of the region surrounded by the bank. There is a problem that this control is complicated.

Further, selection of the ink material is important for stable discharge of the ink from the nozzle. That is, it is required to select the material that meets "requirement specification" for blowing the ink by the inkjet, such as viscosity, surface tension, and optimization of the solvent (increase in the boiling point). Further, it is also required to meet "process specification" relating to the process after the ink impacts on the substrate unit, such as wettability expansion, desiccation, volatility of the solvent, sintering, and solidification.

In many cases, however, there is a tradeoff relationship between the "requirement specification" and the "process specification". It is not easy to form the circuit pattern by using the inkjet technique.

Therefore, the purpose of the present invention is to provide a method of forming a circuit pattern that allows for easier formation of the circuit pattern, and a circuit substrate that has the circuit pattern formed by this forming method.

Solutions to the Problems

In the present invention, a method of forming a circuit pattern is performed by, with moving a substrate unit and a nozzle relatively in one direction, discharging conductive ink to the substrate unit in a belt-like manner out of a slit extending long in a lateral direction orthogonal to the one direction and formed to the nozzle. The method includes: with respect to the substrate unit that has a liquid-repellent region having a liquid repellency to the conductive ink and a lyophilic region having a lyophilic property to the conductive ink and having the same form as a desired circuit pattern, discharging the conductive ink in a belt-like manner to a region including the liquid-repellent region and the lyophilic region.

According to the present invention, the conductive ink is applied to the lyophilic region and, in the liquid-repellent region that is the remaining region, the conductive ink is repelled to flow into the lyophilic region. The lyophilic region onto which the conductive ink is applied has the same form as the desired circuit pattern. This allows for easier formation of the circuit pattern by the conductive film based on the conductive ink.

Here, focus is given to the virtual line orthogonal to one direction that is virtually provided on the substrate unit on which the liquid-repellent region and the lyophilic region are provided. When the entirety (the length) of the lyophilic region located on the virtual line is relatively narrow (short), this results in a thicker conductive film of the conductive ink applied to the lyophilic region. It is considered that one of the reasons thereof is in that the conductive ink discharged on the liquid-repellent region located on the same virtual line is pulled to the lyophilic region located on this virtual line and that the thick conductive film is formed by a large amount of the pulled conductive ink. In contrast, when the entirety of the lyophilic region located on another virtual line is relatively wide (long), the conductive film of the conductive ink applied to the lyophilic region tends to be thin compared to the case where the entirety is narrow.

As discussed above, in the substrate unit on which the circuit pattern is formed by the conductive ink, a large variation in the thickness of the conductive film may occur when the areas of the lyophilic regions are different due to the difference in the position (the position of the virtual line) of the one direction. The large variation in the thickness of the conductive film may cause the variation in the resistance of the circuit wirings. Further, when the entirety (the length) of the lyophilic is relatively narrow (short), the conductive ink applied to the lyophilic region may be unable to remain in the lyophilic region and flow out to the liquid-repellent part.

Accordingly, in the method of forming the circuit pattern, the conductive ink is preferably discharged in a belt-like manner to the substrate unit on which, as the lyophilic region, a plurality of line lyophilic parts on which a plurality of line parts extending long in the one direction are to be formed by the conductive ink in order to transmit a signal to an electronic part, an electrode lyophilic part on which an electrode part provided between the line lyophilic parts and connected to the line part via an electronic part is to be formed by the conductive ink, and a dummy lyophilic part on which a dummy part provided in a region that is between the line lyophilic parts and is other than the electrode lyophilic part and substantially functioning as neither the electrode part nor the line parts is to be formed by the conductive ink are formed.

In this case, the conductive ink is applied onto the line lyophilic part, the electrode lyophilic part, and the dummy lyophilic part. In the liquid-repellent region that is the remaining region, the conductive ink is repelled and flows into the lyophilic region. Further, the dummy lyophilic part is provided to the region which is between the line lyophilic parts and on which the electrode lyophilic part is not formed. Therefore, the dummy lyophilic part can prevent a large amount of the conductive ink from being pulled to the line lyophilic part and the thick conductive film from being formed. Thus, the variation in the thickness of the conductive film can be suppressed.

In addition, in the present invention, a circuit substrate having a predetermined circuit pattern arranged by a conductive film based on conductive ink formed on a lyophilic region of a substrate unit on which the lyophilic region having a lyophilic property to the conductive ink and a liquid-repellent region having a liquid repellency to the conductive ink are formed. The circuit pattern has a plurality of line parts configured to transmit a signal to an electronic part, an electrode part connected to the line parts via an electronic part, and a dummy part substantially functioning as neither the electrode part nor the line parts.

If no dummy part were provided in applying the conductive ink to the substrate unit having the liquid-repellent region and the lyophilic region for forming the circuit pattern, a part of the conductive ink would be pulled and applied to the lyophilic region in which the line part and the electrode part are to be formed. The thickness of the conductive film in the line part and the electrode part would be increased by the pulled conductive ink. In contrast, according to the present invention, a part of the conductive ink remains as a dummy part. This can prevent the increase in the thickness of the conductive film in the line part and the electrode part. As a result, the variation in the thickness of the conductive film can be suppressed, so that the variation in the resistance of the circuit wirings can be suppressed.

Further, it is preferable that, in order to transmit the signal to the electronic part, each of the plurality of line parts is formed extending long in one direction, the electrode part is provided between the line parts, and the dummy part is provided to the region which is between the line parts and is other region than the electrode part. In this case, the dummy part can be distributed in a wide area.

Further, the circuit pattern may be formed as the dummy part separated from the line part and the electrode part and have a land part to which no voltage nor signal is applied. In this case, the dummy part distant from the line part and the electrode part is provided.

Further, the circuit pattern may be formed as the dummy part so as to extend from the line part, which is formed long in one direction, toward the lateral direction crossing the one direction and have a semi-land part to which no electronic part is connected. In this case, the dummy part is formed extending in lateral direction from the line part, but not connected to any electronic part and thus does not substantially function as the line part.

Further, it is preferable that the circuit pattern has a wide part as the dummy part that has substantially the same lateral size as the lateral size of the electrode part orthogonal to the one direction.

If there were no dummy part, the liquid-repellent region would be wider between the line parts. Therefore, the conductive ink would be pulled to its peripheral line part resulting in a thicker conductive film. In contrast, since the above-described wide part is provided, the width of the liquid-repellent region around the wide part becomes substantially the same as the width of the liquid-repellent region around the electrode part. Therefore, the variation in the thickness of the conductive film of the line part can be more effectively suppressed. It is noted that the above term "substantially the same" is intended to include the case where they have the difference of ±10% besides the case where they are completely the same.

Advantageous Effects of the Invention

According to the method of forming the circuit pattern of the present invention, the conductive ink is applied to the lyophilic region, and the conductive ink is repelled and thus not applied to the remaining region, that is, the liquid-repellent region. Further, the lyophilic region to which the conductive ink is applied has the same form as the desired circuit pattern. This allows for easier formation of the circuit pattern.

According to the circuit substrate of the present invention, a part of the applied conductive ink remains as the dummy part. This can prevent the increase in the thickness of the conductive film in the line part and the electrode part. Therefore, the variation in the thickness of the conductive film can be suppressed, so that the variation in the resistance of the circuit wirings can be suppressed.

DESCRIPTION OF EMBODIMENTS

Overview of Application Device and Method of Forming Circuit Pattern

Figure 1:
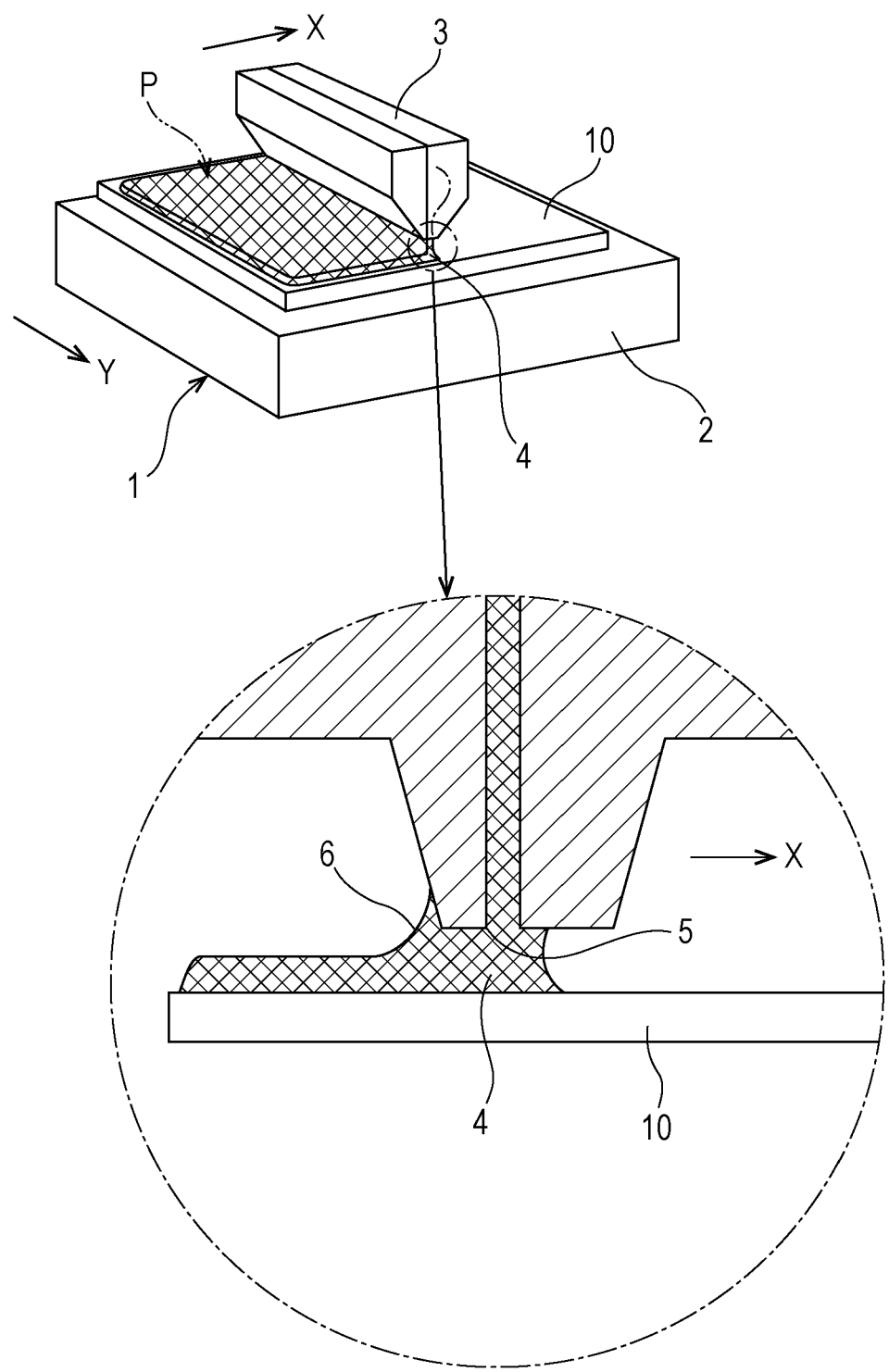
FIG. 1 is a perspective view of a general arrangement of an application device.

FIG. 1 is a perspective view of a general arrangement of an application device 1. The method of forming the circuit pattern of the present invention is performed by the application device 1. The application device 1 has a table 2 adapted to absorb and hold a substrate unit (a base member) 10 and a nozzle 3 adapted to discharge ink 4. The nozzle 3 is moved horizontally in one direction with respect to the table 2 by a not-shown driving device. In FIG. 1, the moving direction of the nozzle 3 is defined as an X direction.

As illustrated in the enlarged cross section of a main part of FIG. 1, a slit (a slit nozzle) 5 is formed in the nozzle 3. This slit 5 is formed so as to extend long and straight in the lateral direction (a Y direction in FIG. 1) orthogonal to the moving direction of the nozzle 3. Further, the width of the slit 5 is wider than the size in the lateral direction of the target region to which the ink 4 is to be applied on the substrate unit 10. The slit 5 is opened downward at the lower end of the nozzle 3.

There is a fine gap provided between the substrate unit 10 and the lower end of the nozzle 3. The ink 4 is supplied to the nozzle 3 by a not-shown pump. The ink 4 is discharged out of the slit 5. The ink 4 is applied onto the substrate unit 10. Further, the discharge amount (the flux) of the ink 4 from the slit 5 is constant. Further, the moving speed of the nozzle 3 and the size of the gap are constant. The ink 4 is solidified on a lyophilic region 11 described later (see FIG. 3) and thus makes a conductive film. A circuit pattern P with a predetermined form is arranged on the substrate unit 10 by the conductive film. The ink 4 includes metal particles, for example, and has conductivity.

As described above, while moving the nozzle 3 in one direction (the X direction) with respect to the substrate unit 10 held on the table 2, the application device 1 discharges the conductive ink 4 out of the slit 5 having longitudinal lateral direction (the Y direction) orthogonal to the one direction onto the entire surface of the substrate unit 10 in a belt-like manner. As a result, the ink 4 remains in the lyophilic region 11 described later while the ink 4 is repelled at a liquid-repellent region 12, and a desired circuit pattern P is formed on the substrate unit 10.

Figure 2:
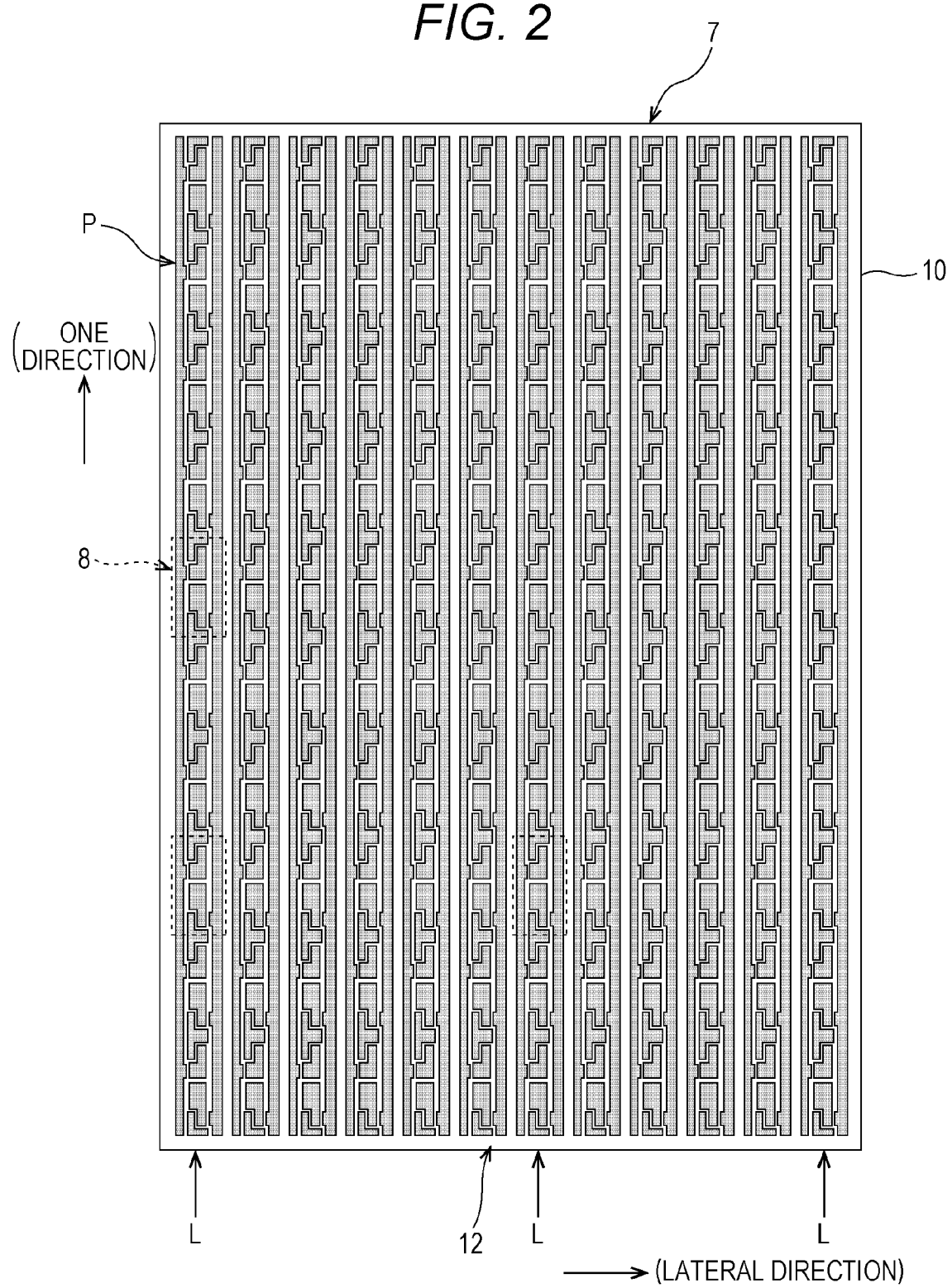
FIG. 2 is a plan view of an overview of a substrate unit on which a circuit pattern is formed.
Figure 3:
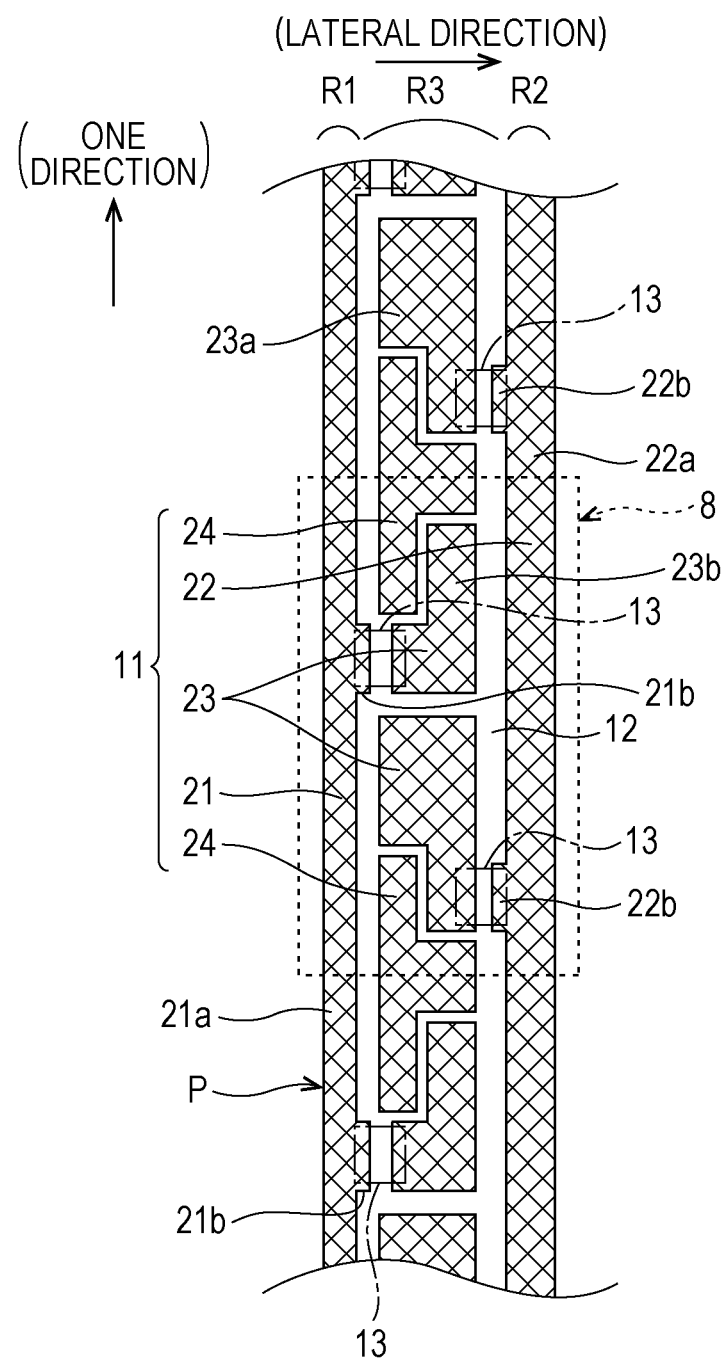
FIG. 3 is an enlarged plan view of a part of the circuit pattern.

Further, a circuit substrate 7 of the present invention has the substrate unit 10 on which the circuit pattern P is formed as described above. FIG. 2 is a plan view of the overview of the substrate unit 10 on which the circuit pattern P is formed, and FIG. 3 is a plan view enlarging a part of the circuit pattern P. It is noted that, in FIG. 2, each part of the circuit pattern P is enlarged for easier illustration.

The circuit substrate 7 of the present embodiment is a substrate applied for TFT circuit units included in organic EL display elements. A fine circuit part 8 (see FIG. 3) is formed correspondingly to each pixel of the display elements. That is, the circuit substrate 7 has a number (the same number as the pixels) of the fine circuit parts 8. In FIG. 3, the area surrounded by the broken line defines one fine circuit part 8. In the circuit pattern P of the present embodiment, one line L is formed by the multiple fine circuit parts 8 being provided continuously along "one direction". Furthermore, multiple lines L are formed in the lateral direction orthogonal to "one direction" as illustrated in FIG. 2. Each of the plurality of lines L has the same arrangement. In the following, the circuit pattern P and the like will be described by focusing on one line L.

In FIG. 2, the circuit substrate 7 has the substrate unit 10 on which the circuit pattern P is formed. As illustrated in FIG. 3, the substrate unit 10 is provided with the lyophilic regions 11 having a lyophilic property to the ink 4 and the liquid-repellent region 12 having a liquid repellency to the ink 4. In FIG. 3, the lyophilic regions 11 are depicted in the cross hatching, the rest of which is the liquid-repellent region 12.

Described will be the relation of the substrate unit 10 having the lyophilic regions 11 (lyophilic property) and the liquid-repellent region 12 (liquid-repellent) with respect to the ink 4, in the present invention. The droplets of the ink 4 are placed on the lyophilic region 11 and the liquid-repellent region 12 in a horizontal state, respectively. It is preferable to employ the combination of the substrate unit 10 and the ink 4 so that the difference between the contact angle of the droplet on the lyophilic region 11 and the contact angle of the droplet on the liquid-repellent region 12 is 10 degrees or greater when they are gradually inclined from the horizontal state and the droplet of the ink 4 starts rolling down from the liquid-repellent region 12. Further, in the present embodiment, the inclination angle at which the ink 4 starts rolling down from the liquid-repellent region 12 is 20 to 50 degrees.

The ink 4 is then discharged to the substrate unit 10 by the above-described application device 1, so that the ink 4 is in a state of being placed on the lyophilic regions 11. On the liquid-repellent region 12, the ink 4 is repelled and unable to remain. The ink 4 placed on the lyophilic regions 11 is then solidified and makes the conductive film. Therefore, a desired circuit pattern P is arranged by the conductive film based on the conductive ink 4 formed on the lyophilic regions 11. The form of the circuit pattern P is based on the form of the lyophilic regions 11.

With Respect to Circuit Pattern P

First Embodiment

In FIG. 3, the circuit pattern P has a plurality of line parts for transmitting signals to the electronic parts 13 such as transistors arranged on the substrate unit 10. The present embodiment has a signal line 21 and a power line 22 as the line parts that are formed extending long and straight in and parallel to "one direction". The signal line 21 and the power line 22 are formed by the conductive film made of the solidified ink 4. It is noted that the "one direction" that is the longitudinal direction of the signal line 21 and the power line 22 corresponds to the "moving direction" of the nozzle 3 of the application device 1.

The circuit pattern P further has electrode parts 23 and dummy parts 24. The electrode parts 23 and the dummy parts 24 are also formed by the conductive film made of the solidified ink 4.

The electrode parts 23 are provided in a region R3 between the signal line 21 and the power line 22. The electrode parts 23 are connected to one of or both of the signal line 21 and the power line 22 via the electronic parts 13. That is, the electrode parts 23 are the parts for causing the organic EL display elements to function. The electrode parts 23 are formed separated from (distant from) the signal line 21 and the power line 22.

The dummy parts 24 are provided to the region near the electrode parts 23, in particular, the region R3 which is between the signal line 21 and the power line 22 and in which no electrode parts 23 is formed (the region other than the electrode parts 23). The dummy parts 24 do not substantially function as any of the electrode part 23, the signal line 21, or the power line 22. The circuit pattern P illustrated in FIG. 3 has land parts (island parts) as the dummy parts 24 to which no voltage nor signal is applied. This land parts are formed separated from the electrode parts 23, the signal line 21, and the power line 22. The perimeter of the dummy part (the land part) 24 is surrounded by the liquid-repellent region 12. The dummy part (the land part) 24 is not electrically connected to the electrode parts 23, the signal line 21, or the power line 22.

As described above, each line L is provided with a pair of the signal line 21 and the power line 22 as one set and with a plurality of electrode parts 23 and a plurality of dummy parts 24 between the signal line 21 and the power line 22.

With Respect to Circuit Pattern P

Second Embodiment

Figure 4:
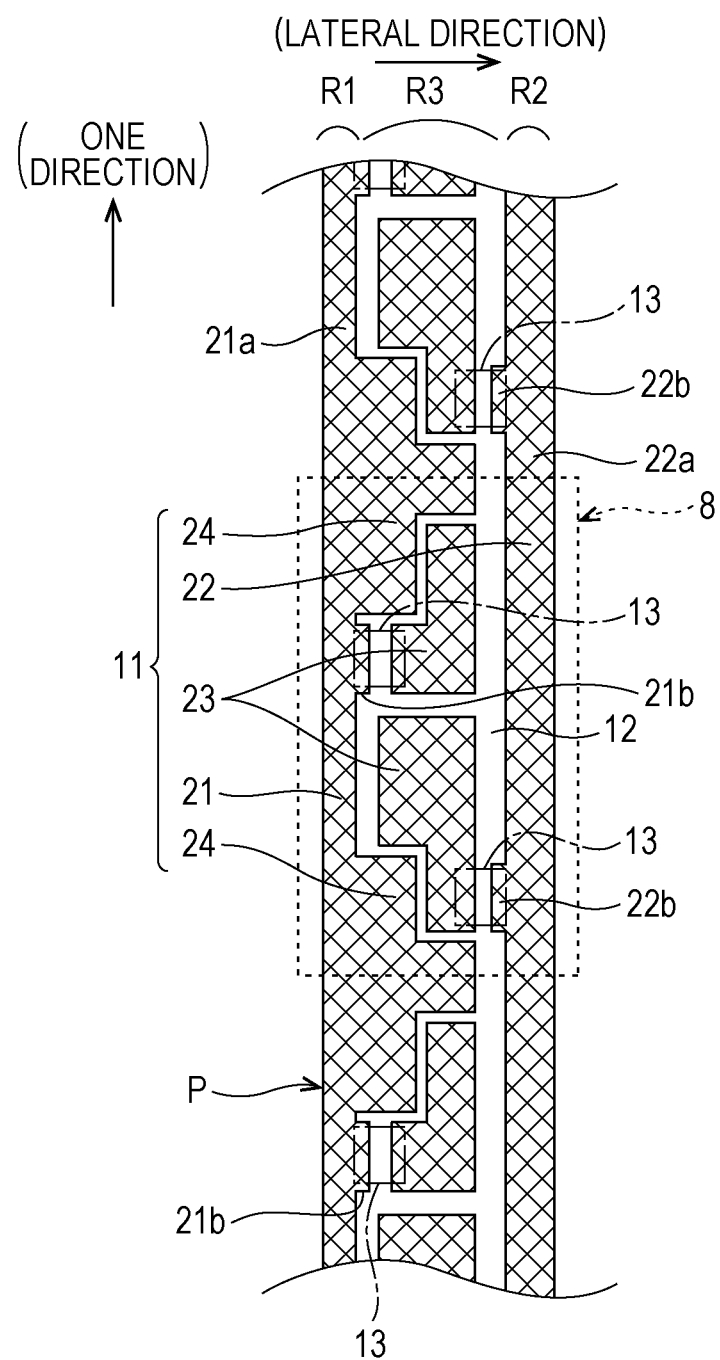
FIG. 4 is a schematic view of a modified example of a dummy part.

FIG. 4 is a schematic view of a modified example of the dummy part 24. The circuit pattern P may have semi-land parts (peninsula parts) as the dummy parts 24. The semi-land part is formed extending in the lateral direction crossing (orthogonal to) one direction from one of the signal line 21 and the power line 22. The dummy parts (the semi-land parts) 24 of the embodiment illustrated in FIG. 4 extend in lateral direction from the signal line 21 and are connected to the signal line 21.

It is noted that the signal line 21 has a signal line main part 21a that is straight in one direction and protruding parts 21b that are connected to the signal line main part 21a and formed extending in the lateral direction. The protruding parts 21b are electrically connected to the electronic parts 13. The protruding parts 21b are the parts for functioning as the signal line 21. Similarly, the power line 22 has a power line main part 22a that is straight in one direction and protruding parts 22b that are connected to the power line main part 22a and formed extending in the lateral direction. The protruding parts 22b are electrically connected to the electronic parts 13. The protruding parts 22b are the parts for functioning as the power line 22. In contrast, the dummy parts 24 formed by the semi-land parts are not the parts for connecting themselves to the electronic parts 13. That is, the dummy parts 24 of the semi-land parts are not the parts provided to function as the signal line 21. The dummy parts 24 are the parts that are not connected to the electronic parts 13 and thus do not substantially function as the signal line 21.

Further, another example of the circuit pattern P may have both land part and semi-land part as the dummy parts 24 though not depicted.

With Respect to Circuit Pattern P

Third Embodiment

Figure 5:
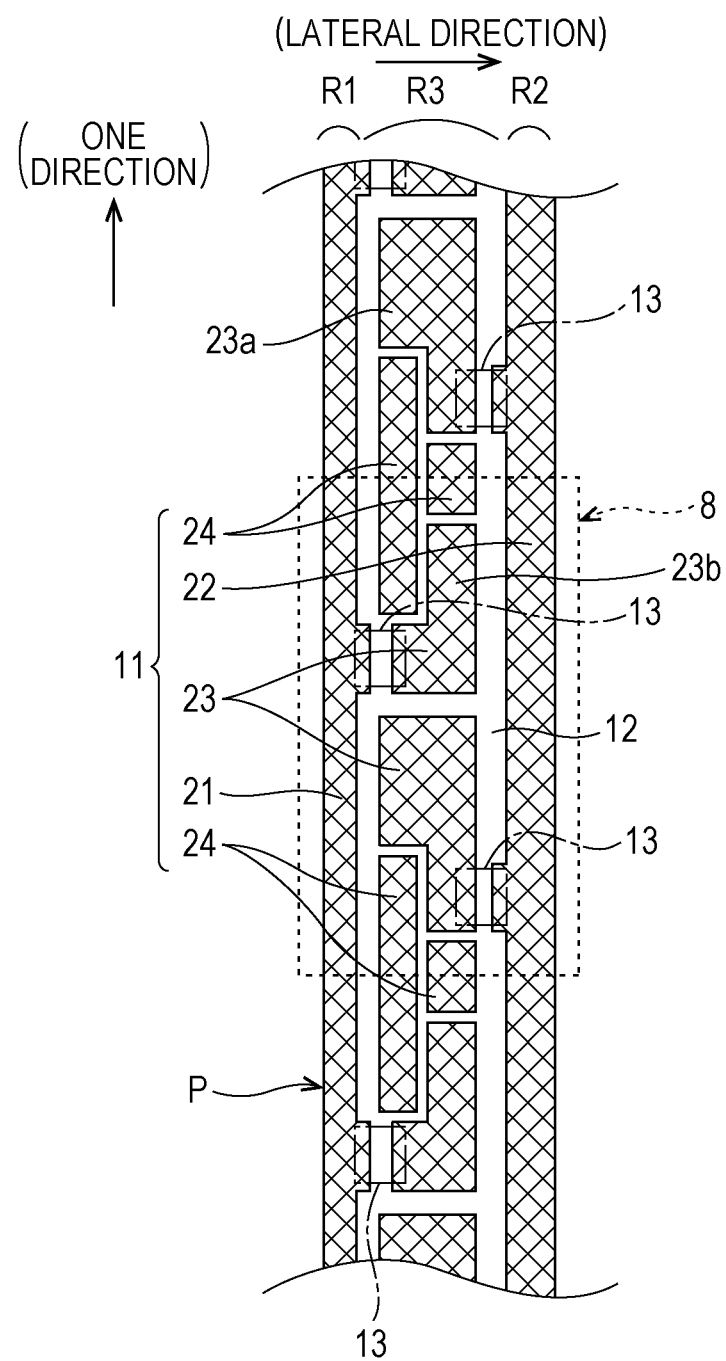
FIG. 5 is a schematic view of another example of the dummy part.

FIG. 5 is a schematic view of another example of the dummy parts 24. It has been described in FIG. 3 that the separated single dummy part 24 between a first electrode part 23a and a neighboring second electrode part 23b. In FIG. 5, there are two separated dummy parts 24 provided between the first electrode part 23a and the second electrode part 23b. As such, the dummy part 24 may be divided and have a plurality of blocks. The arrangements other than the dummy part 24 are the same as those illustrated in FIG. 3 and thus the description thereof is omitted.

With Respect to Circuit Pattern P

Fourth Embodiment

Figure 6:
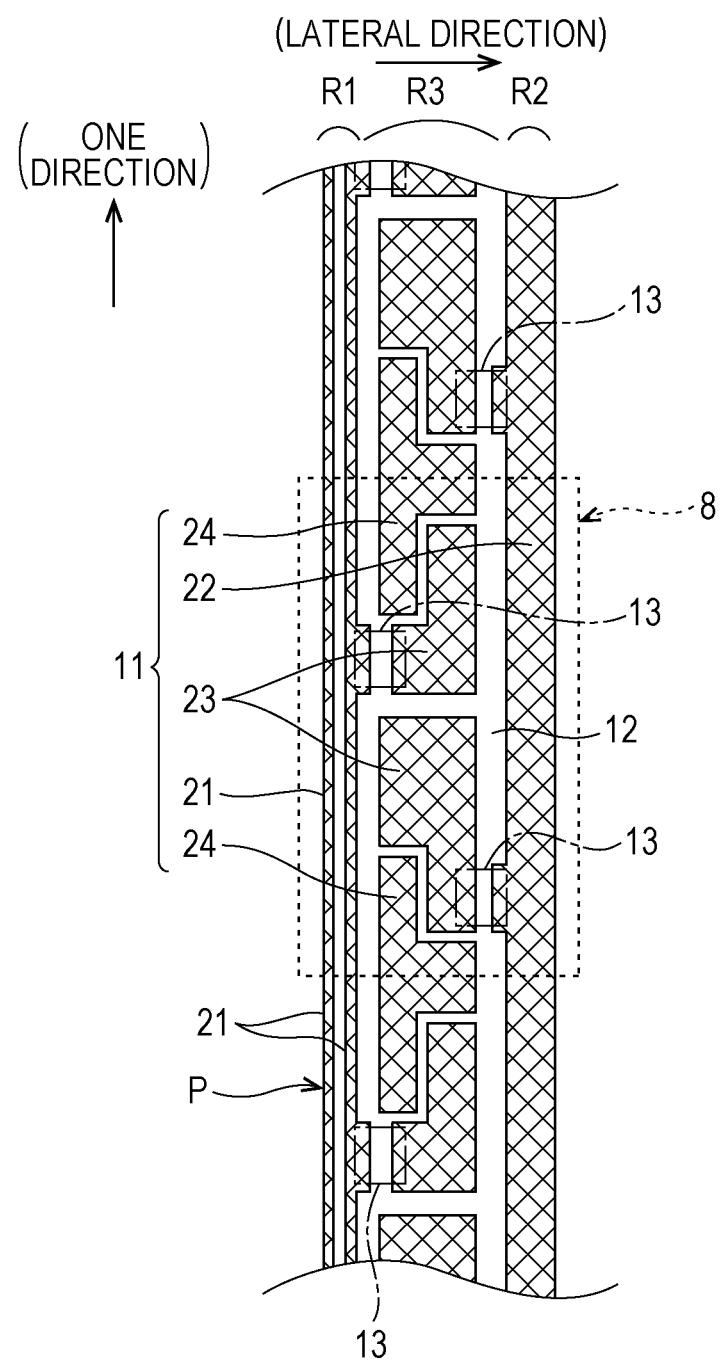
FIG. 6 is a schematic view of yet another example of the circuit pattern.

FIG. 6 is a schematic view of yet another example of the circuit pattern P. In FIG. 3, one signal line 21 is provided for each line L. The circuit pattern P of FIG. 6 has a pair of signal lines 21 as one set. In this case, the cut of the ink 4 is unlikely to occur in the signal lines 21. The arrangements other than the signal lines 21 are the same as those illustrated in FIG. 3 and thus the description thereof is omitted.

As set forth, the circuit pattern P according to each embodiment described above is partitioned into a first region R1 in which the signal line(s) 21 is formed, a second region R2 in which the power line 22 is formed, and a third region R3 between the first region R1 and the second region R2. The electrode parts 23 and the dummy parts 24 are formed in the third region R3.

With Respect to Method of Forming Circuit Pattern P

Described will be a method of forming the circuit pattern P according to each embodiment described above by using the application device 1 of FIG. 1.

As illustrated in FIG. 1, the nozzle 3 is moved in the X direction with respect to the substrate unit 10 held on the stage 2. Here, the one direction along which the signal line 21 and the power line 22 (see FIG. 3) are formed long matches the moving direction (the X direction) of the nozzle 3.

Then, with the nozzle 3 being moved, the conductive ink 4 is discharged out of the slit 5 to the substrate unit 10 in a belt-like manner. On the substrate unit 10, the lyophilic regions 11 have been provided in advance that have a lyophilic property to the conductive ink 4 and have the same form as the desired circuit pattern P. The part other than the lyophilic regions 11 is the liquid-repellent region 12 having a liquid repellency to the conductive ink 4. The ink 4 is evenly discharged out of the slit 5 in a belt-like manner to substantially the entire area including the lyophilic regions 11 and the liquid-repellent region 12 of the substrate unit 10. As a result, the ink 4 is retained (applied) in the lyophilic regions 11, and the ink 4 is repelled at the remaining region, that is, the liquid-repellent region 12 and flows into the lyophilic region 11. As a result, the ink 4 is applied to the lyophilic regions 11 only.

Figure 7:
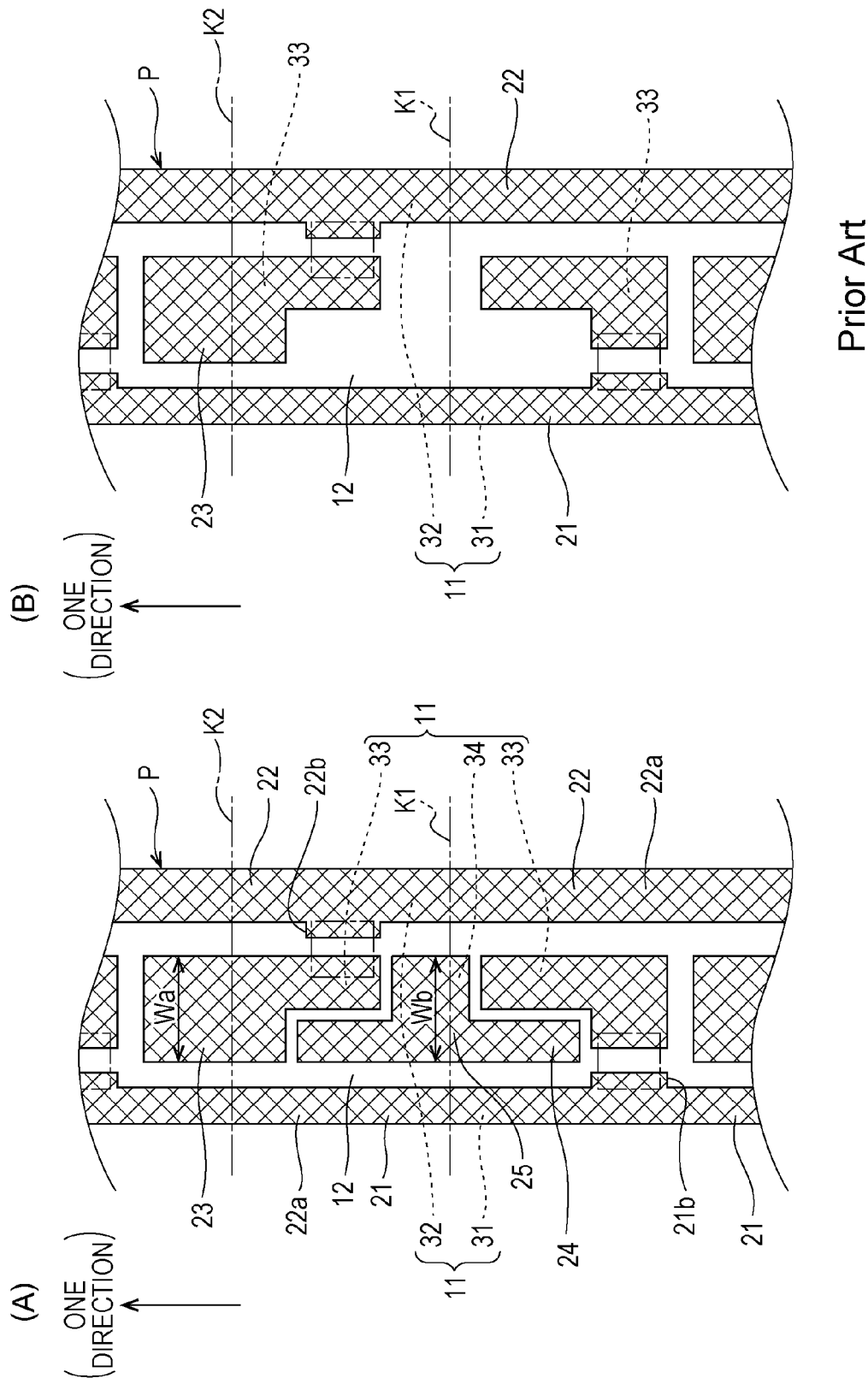
FIG. 7(A) is a schematic view of a circuit pattern of a circuit substrate of the present embodiment.
FIG. 7(B) is a schematic view of the conventional art.

In FIG. 7(A), a plurality of line lyophilic parts, a plurality of electrode lyophilic parts 33, and a dummy lyophilic part 34 are formed as the lyophilic regions 11. In the present embodiment, a signal line lyophilic part 31 and a power line lyophilic part 32 are formed as the line lyophilic parts.

Each of the signal line lyophilic part 31 and the power line lyophilic part 32 is a straight lyophilic part for forming, by the conductive ink 4, the signal line 21 and the power line 22 formed extending long in one direction for transmitting the signal to the electronic parts 13.

The electrode lyophilic parts 33 are provided between the straight pair of the signal line lyophilic part 31 and the power line lyophilic part 32. The electrode lyophilic parts 33 are the lyophilic parts for forming, by the conductive ink 4, the electrode parts 23 connected to the signal line 21 or the power line 22 via the electronic parts 13.

Further, the dummy lyophilic parts 34 are provided in the region which is between the pair of the signal line lyophilic part 31 and the power line lyophilic part 32 and in which no electrode lyophilic part 33 is formed. The dummy lyophilic parts 34 are the lyophilic parts for forming, by the conductive ink 4, the dummy parts 24 that do not substantially function as the electrode parts 23, the signal line 21, or the power line 22.

Then, to the substrate unit 10 on which the lyophilic parts 31, 32, 33, and 34 and the liquid-repellent region 12 are formed, the ink 4 is discharged in a belt-like manner with the nozzle 3 being moved by the application device 1. Then, the ink 4 is applied to the lyophilic parts 31, 32, 33, and 34 only. The ink 4 is repelled at the remaining region, that is, the liquid-repellent region 12.

According to the method of forming the circuit pattern P according to the above-described embodiment, the ink 4 is applied to the lyophilic regions 11, while the ink 4 is not applied to the remaining region, that is, the liquid-repellent region 12. Further, the lyophilic region 11 to which the ink 4 is applied has the same form as the desired circuit pattern. Therefore, the circuit pattern P can be easily formed by solidifying the ink 4.

Further, the ink 4 discharged out of the slit 5 has a low viscosity and a high fluidity and a bead 6 (see the enlarged view of FIG. 1) is formed in a gap between the slit 5 and the substrate unit 10. The bead 6 is formed to have the same lateral size as the size of the lateral direction (the Y direction of FIG. 1) of the slit 5. The bead 6 is maintained in a constant shape while the nozzle 3 is moving. The applied film with a predetermined film thickness is then formed on the substrate unit 10 based on the discharge amount of the ink 4, the moving speed of the nozzle 3, and the size of the gap.

Further, when a change in the ratio of the areas of the lyophilic region 11 and the liquid-repellent region 12 on the substrate unit 10 with which the bead 6 contacts is small with respect to the moving direction (the X direction of FIG. 1) of the nozzle 3, this results in a smaller variation (change) in the film thickness of the ink 4 remaining in the lyophilic region 11. Therefore, the variation (change) becomes small in the film thickness of the conductive film of the solidified ink 4.

Then, in order to reduce the change in the area ratio of the lyophilic region 11 and the liquid-repellent region 12 with respect to the moving direction (the X direction of FIG. 1) of the nozzle 3, the circuit pattern P (the substrate unit 10) of the present embodiment has the dummy parts 24 (the dummy lyophilic parts 34). The technical significance of the dummy part 24 (the dummy lyophilic part 34) will be described by FIG. 7(A) and FIG. 7(B).

FIG. 7(A) is a schematic view of the circuit pattern P of the circuit substrate 7 of the present embodiment (the embodiment illustrated in FIG. 3). FIG. 7(B) is a schematic view of the conventional art. The difference is in that, while the circuit pattern P according to the present embodiment has the dummy part 24, the circuit pattern according to the conventional art has no dummy part but has the liquid-repellent region 12 instead.

In FIG. 7(B), focus is given to a virtual line K1 that is virtually provided on the substrate unit on which the lyophilic region 11 and the liquid-repellent region 12 are provided and is orthogonal to "one direction". The lyophilic region 11 located on the virtual line K1 includes the part across the signal line lyophilic part 31 and the part across the power line lyophilic part 32. The entirety (the length) of the lyophilic region 11 located on the virtual line K1 is relatively narrow (short) while the liquid-repellent region 12 is wide (long). In this case, the conductive film of the conductive ink 4 is thick in the part crossed by the virtual line K1 and in its peripheral region of the signal line lyophilic part 31 and the power line lyophilic part 32. It is considered that one of the reasons thereof is in that much of the conductive ink 4 discharged on the liquid-repellent region 12 located on the same virtual line K1 and on its peripheral region is pulled to the lyophilic region 11 (the signal line lyophilic part 31 and the power line lyophilic part 32) located on the virtual line K1 and on its peripheral region and that the signal line 21 and the power line 22 having the thick conductive film are formed by a large amount of the pulled conductive ink 4.

Furthermore, in FIG. 7(B), focus is given to the second virtual line K2 whose position to the "one direction" is different from the first virtual line K1. The lyophilic region 11 located on the virtual line K2 includes the part across the electrode lyophilic part 33 in addition to the part across the signal line lyophilic part 31 and the part across the power line lyophilic part 32. Therefore, the entirety of the lyophilic region 11 located on the virtual line K2 is wider (longer) than the lyophilic region 11 located on the first virtual line K1.

In this case, on the virtual line K2, the ink 4 remains in the electrode lyophilic part 33, for example, and thus is not pulled so much to the signal line lyophilic part 31 and the power line lyophilic part 32. Therefore, the thickness of the conductive film of the conductive ink 4 applied to the lyophilic region 11 located on the second virtual line K2 and its peripheral region is thinner than that in the case of the first virtual line K1.

As set forth, the difference in the positions of "one direction" (the position of the virtual lines K1 and K2) causes a large variation in the thickness of the conductive film in the lyophilic region 11. In this case, the variation occurs in the resistance of the circuit wirings within the circuit pattern P.

In contrast, as illustrated in FIG. 7(A), the dummy lyophilic part 34 is provided in the region which is between the signal line lyophilic part 31 and the power line lyophilic part 32 and in which no electrode lyophilic part 33 is formed. Therefore, the ink 4 discharged on the virtual line K1 and its peripheral region can remain in the dummy lyophilic part 34. This can suppress the problem that the ink 4 would otherwise be much pulled to the signal line lyophilic part 31, for example, on the virtual line K1 and its peripheral region as seen in the conventional art.

As a result, in the case of the present embodiment, it can be prevented that the conductive film becomes thick in the part crossed by the virtual line K1 and in its peripheral region in the signal line 21 and the power line 22.

Further, also in the present embodiment, the ink 4 remains in the electrode lyophilic part 33 and thus is not pulled so much to the signal line lyophilic part 31 and the power line lyophilic part 32.

As set forth, in the present embodiment, the width (the length) of the lyophilic region 11 located on the first virtual line K1 and the width (the length) of the lyophilic region 11 located on the second virtual line K2 are substantially the same. Therefore, the variation in the thickness of the conductive film can be suppressed even when the positions of "one direction" (the positions of the virtual lines K1 and K2) are different. As a result, this allows for the suppression of the variation in the resistance of the circuit wirings in the line L.

Further, as illustrated in FIG. 7(A), the circuit pattern P according to the present embodiment has, as the dummy part 24, a wide part 25 having a lateral size Wb that is substantially the same as a lateral size Wa of the electrode part 23.

As such, the wide part 25 is provided as the dummy part 24 in substantially the same lateral size as the electrode part 23. Thus, the width of the liquid-repellent region 12 around the wide part 25 is substantially the same width as the liquid-repellent region 12 around the electrode part 23. The signal line 21 and the power line 22 are formed in the region including the electrode parts 23 and the region including the wide part 25, respectively, by the ink 4 discharged in a constant flux. Therefore, the variation in the thickness of the conductive film can be more effectively suppressed. It is noted that the above term "substantially the same" regarding the lateral sizes Wa and Wb is intended to include the case where they have the difference of ±10% besides the case where they are completely the same.

For example, in the present embodiment, the size in one direction of the fine circuit part 8 (see FIG. 3) is 400 μm and the lateral size (the size from the left end of the signal line 21 to the right end of the power line 22) is 150 μm. When the lateral size Wa of the electrode part 23 is 100 μm, the lateral size (Wa) of the dummy part 24 (the wide part 25) may be greater than or equal to 90 μm and less than or equal to 110 μm.

It is noted that, as illustrated in FIG. 5, when one dummy part 24 has a plurality (two in FIG. 5) of blocks, the total lateral size of each block is the lateral size of the dummy part 24. The total size of the dummy part 24 is the size (Wb) of the wide part 25. The total size (Wb) of the wide part 25 and the lateral size Wa of the electrode part 23 are substantially the same.

Figure 8:
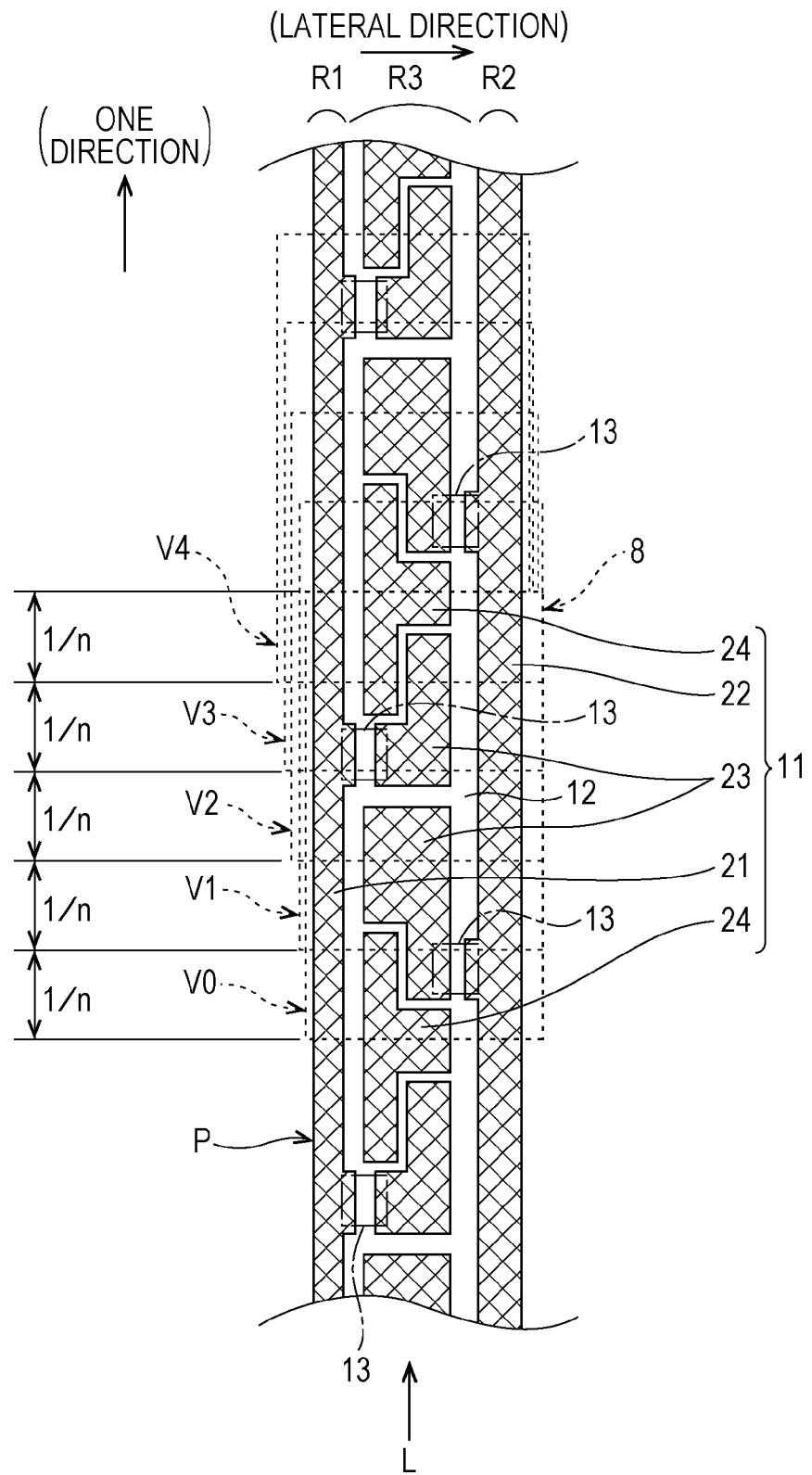
FIG. 8 is a schematic view of a circuit pattern.

Further, as illustrated in FIG. 8, described will be the area of the conductive film (the lyophilic region 11) located in the fine circuit part 8 for each line L. It is assumed that the fine circuit part 8 is equally divided into n (n is an integer) in "one direction" (equally divided into five in FIG. 8).

Then, the area of the conductive film (the lyophilic region 11) located in a virtual region V0 corresponding to the fine circuit part 8 is denoted as A0. The area of the conductive film located in a first move region V1 obtained by moving the region having the same area as the virtual region V0 in "one direction" by 1/n pitch is denoted as A1. The area of the conductive film located in a second move region V2 obtained by moving the first move region V1 in "one direction" by another 1/n pitch is denoted as A2. Similarly, the areas of the conductive film located in respective regions obtained by moving the move region by 1/n pitch each in total n times are denoted as A3, A4, and A5. In this case, in the present embodiment, the dummy part 24 is provided so that the variation in these areas A1 to A5 is 5% or less. It is noted that the variation (%) is a value derived by the expression of deviation/average × 100.

According to the above arrangement, as the case the wide part 25 is provided as the dummy part 24, the variation in the thickness of the conductive film of the signal line 21 and the power line 22 can be more effectively suppressed, so that the variation in the resistance of the circuit wirings can be suppressed.

With Respect to Circuit Pattern P

Fifth Embodiment

Figure 9:
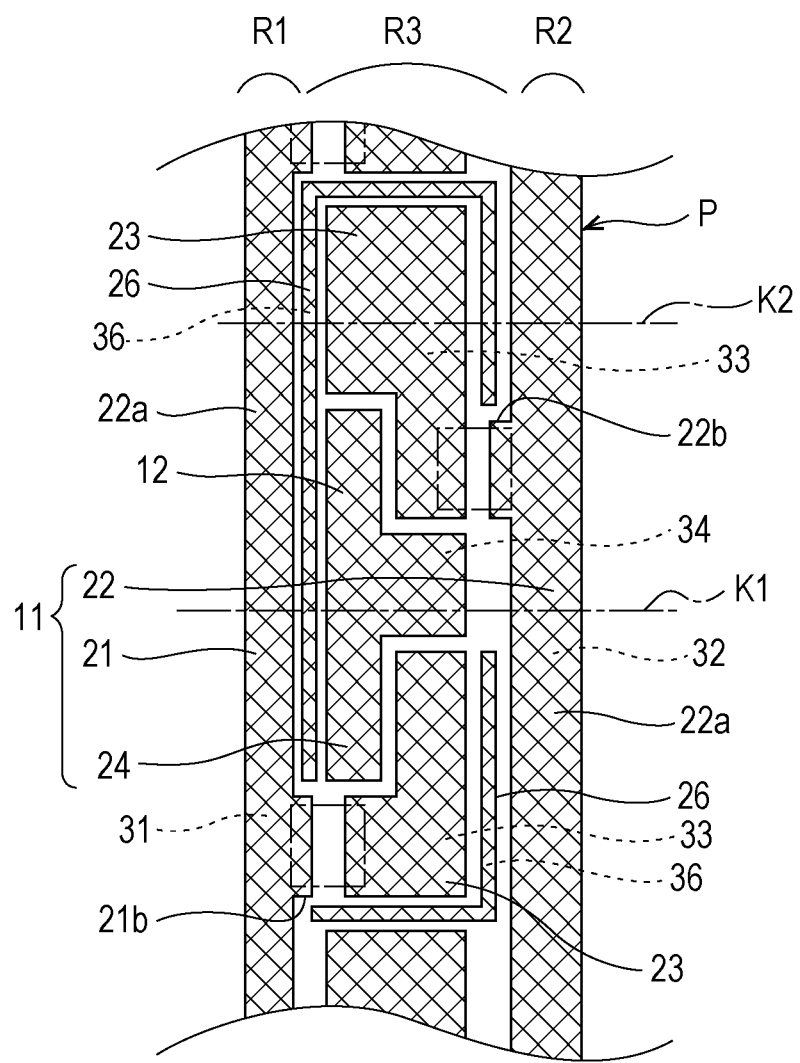
FIG. 9 is a schematic view of yet another example of the circuit pattern.

FIG. 9 is a schematic view of yet another example of the circuit pattern P. This circuit pattern P has frame parts 26 each surrounding the electrode part 23 and the dummy part 24. The frame parts 26 are also formed by the ink 4 discharged out of the slit 5 at the same time as the formation of the peripheral electrode parts 23 and the dummy parts 24. Further, the frame parts 26 are also formed by the conductive film based on the ink 4 placed on frame lyophilic parts 36. The frame parts 26 are formed in the third region R3 between the signal line 21 and the power line 22.

The frame parts 26 can prevent the occurrence of the coffee stain phenomenon that, when the ink 4 placed on the electrode lyophilic part 33 and the dummy lyophilic part 34 is dried and the conductive film is formed, the film thickness at the edge of the lyophilic parts 33 and 34 is larger than that at the center part. The frame parts 26 (the frame lyophilic parts 36) are provided near the electrodes 23 and the dummy parts 24 (the electrode lyophilic parts 33 and the dummy lyophilic parts 34). It is preferable that the frame parts 26 (the frame lyophilic parts 36) are provided within the gap (the liquid-repellent region 12) of 10 μm. The frame parts 26 are formed in the third region R3. Further, the frame part 26 is categorized in the dummy part 24 because of not being connected to the electronic parts 13.

Others

Further, in the method of forming the circuit pattern according to the present embodiment, the signal line 21 and the power line 22 are formed in a continuous manner without being cut in "one direction". The ink 4 is applied along this "one direction". This allows the circuit pattern P to be formed by the continuous discharge of the ink 4 out of the slit 5. Thus, the cut of the bead 6 (see FIG. 1) by the ink 4 can be prevented and the application unevenness and the like can be suppressed.

Further, the starting position of the application operation to the circuit substrate 7, that is, the discharge starting position of the ink 4 out of the slit 5 is the end of the substrate unit 10 (the lower end in the case of FIG. 2). This end is preferably the liquid-repellent region 12 over the entire lateral length. In this case, the formation of the first bead 6 can be made at the liquid-repellent region 12. It is further preferable that the following control is implemented, for example. That is, the first bead 6 is formed at the end liquid-repellent region 12. Then, the pump for discharging the ink 4 is stopped temporarily or the flux of the ink is reduced. The flux of the ink 4 is again increased when the slit 5 moves from the end liquid-repellent region 12 to the target region of the application including the fine circuit part 8.

Alternatively, at the end of the substrate unit 10, the first bead 6 may be formed in the lyophilic part provided as the dummy pattern near the circuit region and then the slit 5 may be moved to the target region of the application.

Further, the application operation may be made with multiple circuit substrates 7 placed on the table 2. Here, in the case where the formed circuit patterns P are different for respective circuit substrates 7, the discharge amount of the ink 4, the moving speed of the nozzle 3, and the size of the gap may be changed depending on the circuit pattern P.

Further, the application completion position (the upper end in the case of FIG. 2) is preferably the liquid-repellent region. It is preferable to absorb the ink 4 discharged to the liquid-repellent region that is the completion position. This can prevent the bubble from being mixed inside the slit 5.

Further, the circuit substrate 7 of the present invention and the circuit pattern P formed by the forming method are not limited to the depicted forms, but may be other forms within the scope of the present invention. In the above-described embodiment, the circuit substrate 7 has been described as the substrate applied to the TFT circuit units included in the organic EL display elements. The circuit substrate 7 may be the substrate applied to other electric equipment.

Further, the above embodiments have been described with the case where the application operation is made with the substrate unit 10 being held by the table 2. When the substrate unit is soft, however, the conductive ink may be discharged from the fixed nozzle with the substrate unit being conveyed by the roll-to-roll, in particular. That is, the substrate unit and the nozzle may be moved relatively in one direction.

Further, in FIG. 4, the case where the dummy part 24 is connected to a part of the signal line 21 has been described. The dummy part 24 may be connected to a part of the power line 22 or a part of the electrode part 23 though not depicted.

DESCRIPTION OF REFERENCE SIGNS

3 Nozzle
4 Ink (Conductive ink)
5 Slit
10 Substrate unit
11 Lyophilic region
12 Liquid-repellent region
13 Electronic part
21 Signal line (line part)
22 Power line (line part)

23 Electrode part
24 Dummy part
25 Wide part
31 Signal line lyophilic part (line lyophilic part)
32 Power line lyophilic part (line lyophilic part)
33 Electrode lyophilic part
34 Dummy lyophilic part
P Circuit pattern

The invention claimed is:

1. A method of forming a circuit pattern, comprising:
with moving a substrate unit on which a liquid-repellent region having a liquid repellency to conductive ink and a lyophilic region having a lyophilic property to the conductive ink and having the same form as a desired circuit pattern are formed, and a nozzle relatively in one direction, discharging the conductive ink in a belt-like manner to a region including the liquid-repellent region and the lyophilic region of the substrate unit out of a slit extending long in a lateral direction orthogonal to the one direction and formed to the nozzle.

2. The method of forming the circuit pattern according to claim 1, wherein the conductive ink is discharged in the belt-like manner to the substrate unit on which, as the lyophilic region,
a plurality of line lyophilic parts on which a plurality of line parts extending long in the one direction are to be formed by the conductive ink in order to transmit a signal to an electronic part,
an electrode lyophilic part on which an electrode part provided between the line lyophilic parts and connected to the line part via an electronic part is to be formed by the conductive ink, and
a dummy lyophilic part on which a dummy part provided in a region that is between the line lyophilic parts and is other than the electrode lyophilic part and substantially functioning as neither the electrode part nor the line parts is to be formed by the conductive ink are formed.

3. A circuit substrate comprising:
a substrate unit on which a lyophilic region comprising a lyophilic property to the conductive ink and a liquid-repellent region comprising a liquid repellency to a conductive ink are formed; and
a circuit pattern arranged by a conductive film based on the conductive ink formed on the lyophilic region of the substrate unit, and comprising a plurality of line parts configured to transmit a signal to an electronic part, an electrode part connected to the line parts via an electronic part, and a dummy part substantially functioning as neither the electrode part nor the line parts.

4. The circuit substrate according to claim 3, wherein
each of the plurality of line parts is formed extending long in one direction in order to transmit a signal to an electronic part,
the electrode part is provided between the line parts, and
the dummy part is provided to a region that is between the line parts and is other than the electrode part.

5. The circuit substrate according to claim 3, wherein the circuit pattern comprises a land part as the dummy part that is formed separated from the line parts and the electrode part and to which no voltage nor signal is applied.

6. The circuit substrate according to claim 4, wherein the circuit pattern comprises a land part as the dummy part that is formed separated from the line parts and the electrode part and to which no voltage nor signal is applied.

7. The circuit substrate according to claim 3, wherein the circuit pattern comprises a semi-land part as the dummy part that is formed extending, from the line parts formed long in one direction, in a lateral direction crossing the one direction and not connected to any electronic part.

8. The circuit substrate according to claim 4, wherein the circuit pattern comprises a semi-land part as the dummy part that is formed extending, from the line parts formed long in one direction, in a lateral direction crossing the one direction and not connected to any electronic part.

9. The circuit substrate according to claim 5, wherein the circuit pattern comprises a semi-land part as the dummy part that is formed extending, from the line parts formed long in one direction, in a lateral direction crossing the one direction and not connected to any electronic part.

10. The circuit substrate according to claim 6, wherein the circuit pattern comprises a semi-land part as the dummy part that is formed extending, from the line parts formed long in one direction, in a lateral direction crossing the one direction and not connected to any electronic part.

11. The circuit substrate according to claim 3, wherein the circuit pattern comprises a wide part as the dummy part that has the substantially same lateral size as a lateral size of a lateral direction orthogonal to a direction in which the line part extends of the electrode part.

12. The circuit substrate according to claim 4, wherein the circuit pattern comprises a wide part as the dummy part that has the substantially same lateral size as a lateral size of a lateral direction orthogonal to a direction in which the line part extends of the electrode part.

13. The circuit substrate according to claim 5, wherein the circuit pattern comprises a wide part as the dummy part that has the substantially same lateral size as a lateral size of a lateral direction orthogonal to a direction in which the line part extends of the electrode part.

14. The circuit substrate according to claim 6, wherein the circuit pattern comprises a wide part as the dummy part that has the substantially same lateral size as a lateral size of a lateral direction orthogonal to a direction in which the line part extends of the electrode part.

15. The circuit substrate according to claim 7, wherein the circuit pattern comprises a wide part as the dummy part that has the substantially same lateral size as a lateral size of a lateral direction orthogonal to a direction in which the line part extends of the electrode part.

16. The circuit substrate according to claim 8, wherein the circuit pattern comprises a wide part as the dummy part that has the substantially same lateral size as a lateral size of a lateral direction orthogonal to a direction in which the line part extends of the electrode part.

17. The circuit substrate according to claim 9, wherein the circuit pattern comprises a wide part as the dummy part that has the substantially same lateral size as a lateral size of a lateral direction orthogonal to a direction in which the line part extends of the electrode part.

18. The circuit substrate according to claim 10, wherein the circuit pattern comprises a wide part as the dummy part that has the substantially same lateral size as a lateral size of a lateral direction orthogonal to a direction in which the line part extends of the electrode part.

* * * * *